United States Patent
Porter et al.

(10) Patent No.: US 11,699,466 B2
(45) Date of Patent: *Jul. 11, 2023

(54) BIASING ELECTRONIC COMPONENTS USING ADJUSTABLE CIRCUITRY

(71) Applicant: Micron Technology, Inc., Boise, ID (US)

(72) Inventors: John David Porter, Boise, ID (US); Suryanarayana B. Tatapudi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/546,026

(22) Filed: Dec. 8, 2021

(65) Prior Publication Data

US 2022/0101891 A1 Mar. 31, 2022

Related U.S. Application Data

(63) Continuation of application No. 16/934,213, filed on Jul. 21, 2020, now Pat. No. 11,232,819.

(51) Int. Cl.
*G11C 7/06* (2006.01)
*G11C 5/14* (2006.01)

(52) U.S. Cl.
CPC ............. *G11C 7/062* (2013.01); *G11C 5/147* (2013.01)

(58) Field of Classification Search
CPC .................................. G11C 7/062; G11C 5/147

USPC .................................................. 365/185.21
See application file for complete search history.

(56) References Cited

U.S. PATENT DOCUMENTS

| | | | |
|---|---|---|---|
| 6,515,903 | B1 | 2/2003 | Le et al. |
| 11,232,819 | B1 | 1/2022 | Porter et al. |
| 2010/0164465 | A1 | 7/2010 | Yang |
| 2016/0064091 | A1 | 3/2016 | Shin |
| 2022/0028433 | A1 | 1/2022 | Porter et al. |

FOREIGN PATENT DOCUMENTS

CN 103714851 A * 4/2014 ............... G11C 7/00

* cited by examiner

*Primary Examiner* — Huan Hoang
(74) *Attorney, Agent, or Firm* — Greenberg Traurig

(57) ABSTRACT

Embodiments relate to improving the biasing of active electronic components such as, for example, sense amplifiers. Embodiments include an adjustable bias signal generator that receives a reference signal as an input and generates a corresponding bias signal as an output. The adjustable bias signal generator may comprise a voltage driver and capacitor divider circuitry. In some embodiments, the capacitor divider circuitry is configurable by selecting specific capacitor dividers using a digital code. In other embodiments, the voltage driver is adjustable by applying different trim settings to tune the output of the voltage driver. The voltage driver may be temperature compensated by multiplexing different trim settings that correspond to different temperatures.

20 Claims, 6 Drawing Sheets

BIASING ELECTRONIC COMPONENTS USING ADJUSTABLE CIRCUITRY

RELATED APPLICATIONS

The present application is a continuation application of U.S. patent application Ser. No. 16/934,213 filed Jul. 21, 2020, the entire disclosures of which applications are hereby incorporated herein by reference.

FIELD OF THE TECHNOLOGY

At least some embodiments disclosed herein relate generally to providing a bias current to electronic devices such as, for example, sense amplifiers.

BACKGROUND

Active electronic components (e.g., sense amplifiers) may need to be biased to a particular voltage or current to properly operate. Biasing refers to providing particular operating conditions to a component or system so that the component or system operates at a desired operating point. Biasing may involve providing a specific voltage or current to a terminal of an electronic component.

DETAILED DESCRIPTION

Figure 1:
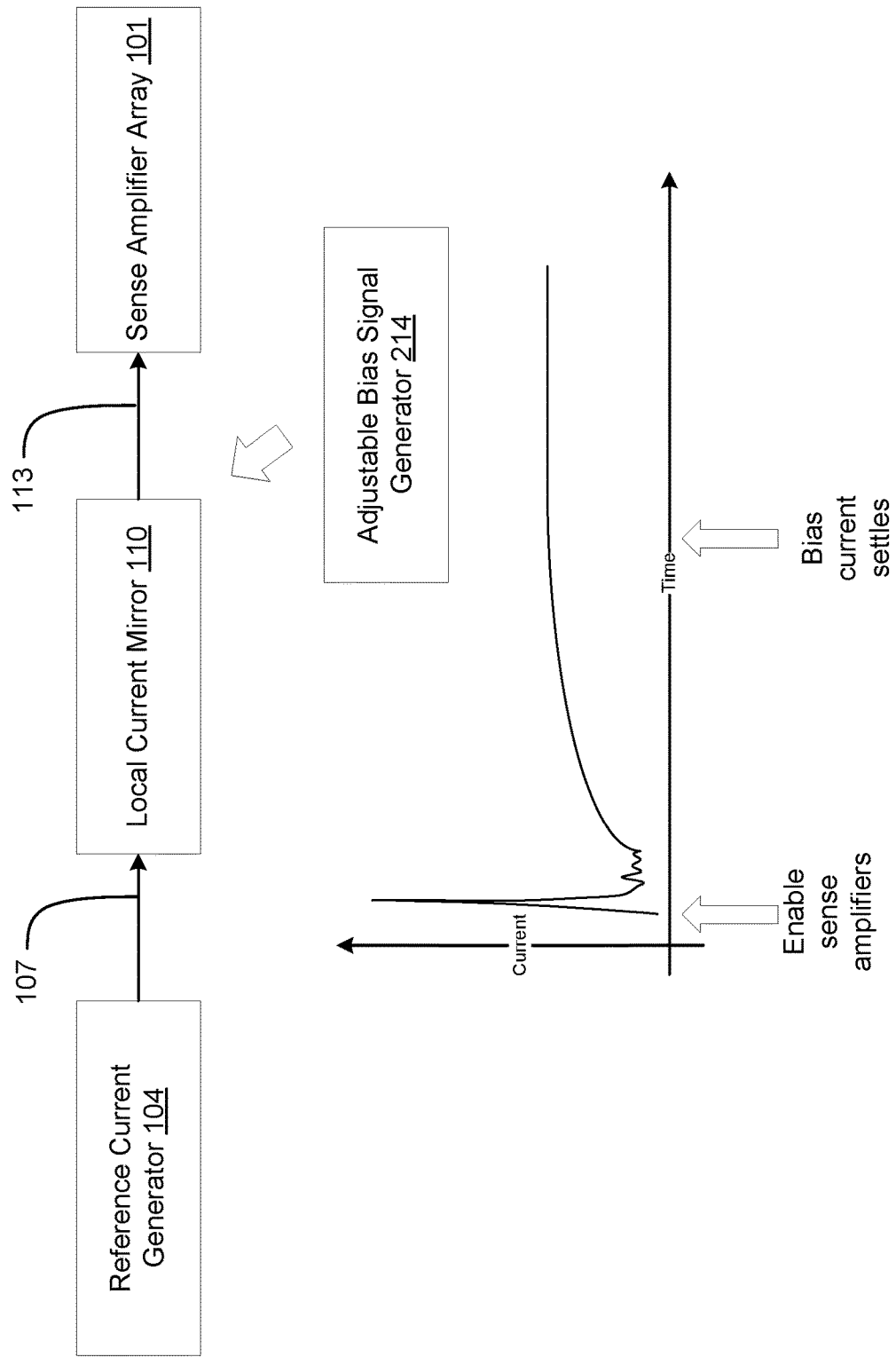
FIG. 1 is a drawing of a schematic and waveform diagram of biasing a sense amplifier array.

FIG. 1 shows an example of providing a biasing current to a sense amplifier array 101. A sense amplifier array 101 may include a series of sense amplifiers that sense voltage or current of memory cells in a memory array. The sense amplifiers in the sense amplifier array 101 may need to be biased at a particular bias current (e.g., 8 microamps) before arriving at an operating point where the sense amplifier may properly perform. To bias the sense amplifiers, a reference current generator 104 may generate a reference current 107 that is equal to the bias current. The reference current generator 104 may be positioned anywhere in the electronic device that contains the sense amplifier array 101. A local current mirror 110 may mirror the reference current 107 and generate a bias current 113. The local current mirror 110 may be positioned closer to the sense amplifier array 101 compared to the reference current generator 104. The local current mirror 110 maintains the outputted bias current 113 while minimizing dependence on the load (e.g., the active circuitry being driven by the bias current).

The sense amplifier array 101 may spend the majority of its time in a standby mode where it remains inactive for power conservation purposes. As a result, a bias current 113 is applied only when the sense amplifier array 101 is needed. FIG. 1 shows a waveform of the bias current 113 over time. When the bias current is generated, the bias current may initially spike as a result of the current mirror 110 operating as a current source or due to the initial conditions within current mirror 110. The bias current may then increase to the target bias current level where it eventually settles. The time it takes to settle may be substantially long (e.g., several nanoseconds). The timing of generating and supplying the bias current may impact the speed in which the active circuitry may perform.

Various embodiments of the present disclosure relate to improved circuitry to bias active electronic components such as, for example, sense amplifiers. Rather than using a simple current mirror that serves as a local current supply, embodiments are directed to an adjustable bias signal generator 214 that has improved timing characteristics and better control over changing bias conditions. This may provide for greater responsiveness and control over biasing a sense amplifier array. The adjustable bias signal generator 214 may be positioned local with respect to a sense amplifier array 101 and may replace or otherwise improve upon the architecture of a local current mirror.

In some embodiments, the adjustable bias signal generator 214 includes a fixed voltage driver and a set of selectable capacitor dividers. The bias signal generator 214 is adjustable by selecting different capacitor dividers to control the strength of the outputted bias signal. Specifically, the capacitor dividers are selected to closely match the strength of the reference signal. The appropriate capacitor divider may be selected using a digital code that identifies a specific capacitor divider. A state machine may be used to initialize and periodically update which digital code to select. The state machine may store the desired digital code for the correct capacitor divider. The voltage driver may be coupled to the selected capacitor divider to generate the bias signal.

In other embodiments, the adjustable bias signal generator 214 includes an adjustable voltage driver and a fixed capacitor divider. The voltage driver may be a digital voltage driver that has a voltage supply that is trimmed during manufacturing. The trim settings adjust the voltage output of the voltage driver. When coupled to the fixed capacitor divider, the adjustable bias signal generator 214 generates a bias signal with improved characteristics.

Exemplary embodiments detailing the adjustable bias signal generator 214 and related operation are described below in order to illustrate various features with respect to the remaining FIGs. The embodiments described herein are not intended to be limiting as to the scope, but rather are intended to provide examples of the components, use, and operation of the invention.

Figure 2:
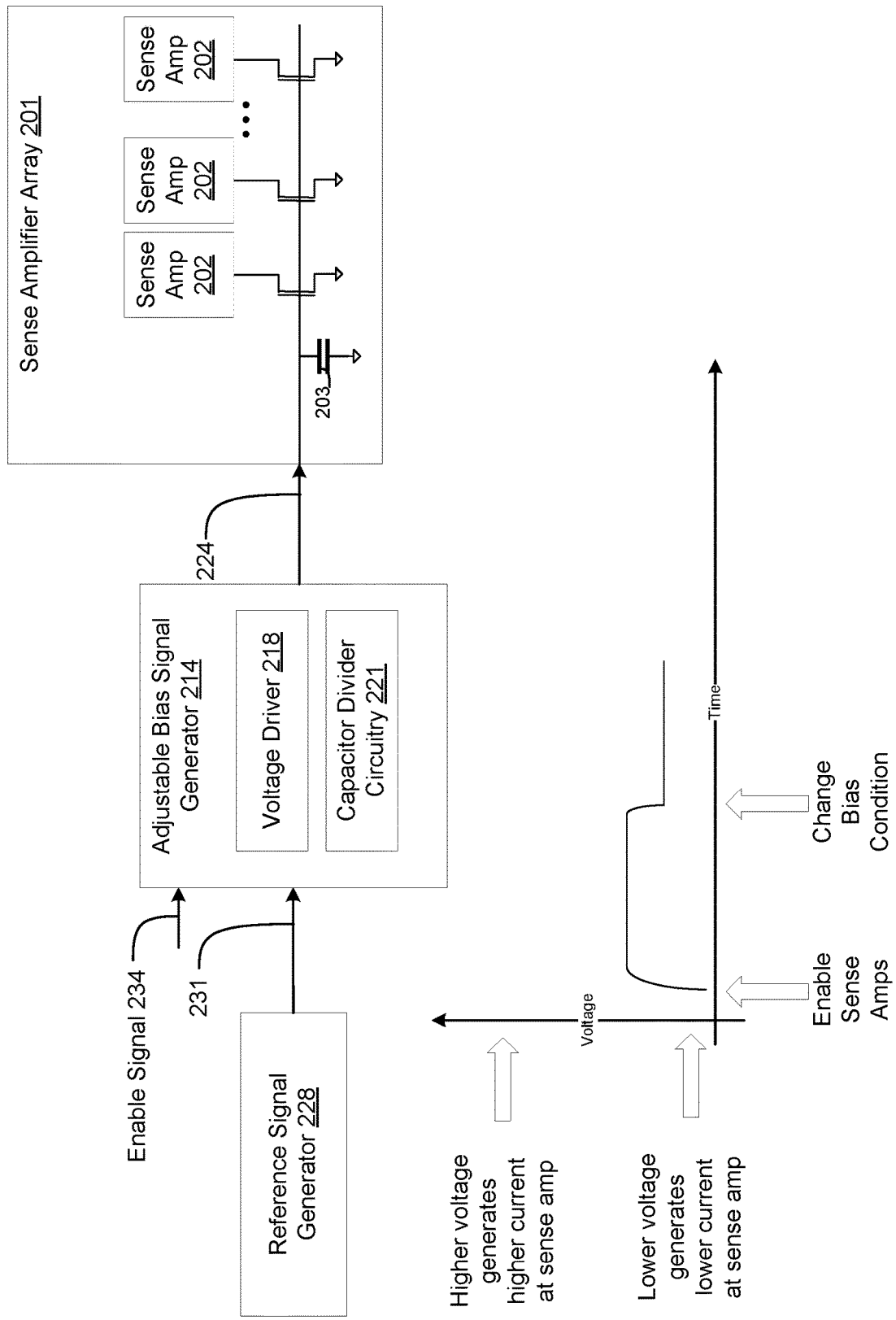
FIG. 2 is a drawing of a schematic and waveform diagram of biasing a sense amplifier array according to embodiments of the present disclosure.

FIG. 2 is a drawing of a schematic and waveform diagram of biasing a sense amplifier array 201 according to embodiments of the present disclosure. The principles shown in FIG. 2 may apply to other active electronic components, however, for illustration purposes, FIG. 2 shows the biasing of active electronic components made up of sense amplifiers 202.

Each sense amplifier 202 in the sense amplifier array 201 may be coupled to a bit line, word line, or other terminal(s) of memory cell(s). Each sense amplifier 202 may sense the state of a memory cell after the sense amplifier reaches an operating state. In addition, each sense amplifier may be placed in different operating states by biasing the sense amplifiers 202 to different levels. For example, an 8 microamp current (e.g., a high bias signal) may place the sense amplifier in a first operating/bias state while a 4 microamp current (e.g., a low bias signal) may place the sense amplifier in a second operating/bias state.

The sense amplifier array 201 may be modeled as an active load having an effective capacitance 203. This effective capacitance 203 of the sense amplifier array 201 may slow down the ability of a conventional current supply (e.g., a local current mirror) to reach a sufficient bias level to drive the sense amplifiers 202. However, embodiments of the present disclosure use an adjustable bias signal generator 214 to efficiently drive the sense amplifiers 202.

The adjustable bias signal generator 214 is adjustable, meaning that it includes components that are configurable and not fixed. This means that its components may be trimmed, selected, deselected, programmed, modified, or otherwise changed. The adjustable bias signal generator 214 may include a voltage driver 218, capacitor divider circuitry 221, and potentially other components. A voltage driver 218 may utilize a regulated voltage where the load being driven has little impact on the output voltage. The voltage driver 218 may utilize a bandgap reference voltage generator.

The capacitor divider circuitry 221 includes a plurality of capacitor dividers. A capacitor divider comprises a set of capacitors arranged to achieve a particular capacitance ratio. The voltage driver 218 coupled to a capacitor divider in the capacitor divider circuitry 221 produces a bias signal 224 that drives the sense amplifier array 201.

FIG. 2 also shows a reference signal generator 228 that generates a reference signal 231. The reference signal may be a voltage or current having a particular strength that is selected to assist in the biasing of the sense amplifier array 201. The adjustable bias signal generator 214 may receive the reference signal 231 as an input and generate a corresponding bias signal 224 as an output. For example, the reference signal 231 may be used to adjust or otherwise configure the adjustable bias signal generator 214 to produce a bias signal 224. The bias signal 224 is generated to match the strength of the reference signal 231. The reference signal 231 may be a high signal to generate a high bias signal or a low signal to generate a low bias signal.

According to embodiments, the bias signal 224 has a waveform that conforms to a step function. In other words, the bias signal 224 may be generated from a standby state and quickly achieve the target drive strength within only a few nanoseconds.

In some embodiments, the adjustable bias signal generator 214 receives an enable signal 234. The enable signal 234 is used to activate the adjustable bias signal generator 214 so that it quickly generates the bias signal 224 upon it being enabled. FIG. 2 shows a waveform diagram upon the adjustable bias signal generator being enabled by an enable signal 234. The enable signal 234 triggers an enable switch to allow the sense amplifier array 201 to enter or exit a standby mode.

The waveform in FIG. 2 represents the level of the bias signal 224 outputted by the adjustable bias signal generator 214 over time. As shown, the waveform immediately steps up to a high bias voltage level to generate a higher current in sense amp 202. Later, the bias signal may step down to a lower bias level to generate a lower current in sense amp 202. Thus, the sense amplifier array 201 being driven by the bias signal 224 may be quickly placed into a first, high bias operating state with a high bias signal voltage and then placed into a second, low bias operating state with a low bias signal voltage. The transition from standby mode to high bias mode and the transition from high bias mode to low bias mode may occur quickly through the usage of the adjustable bias signal generator 214.

Figure 3:
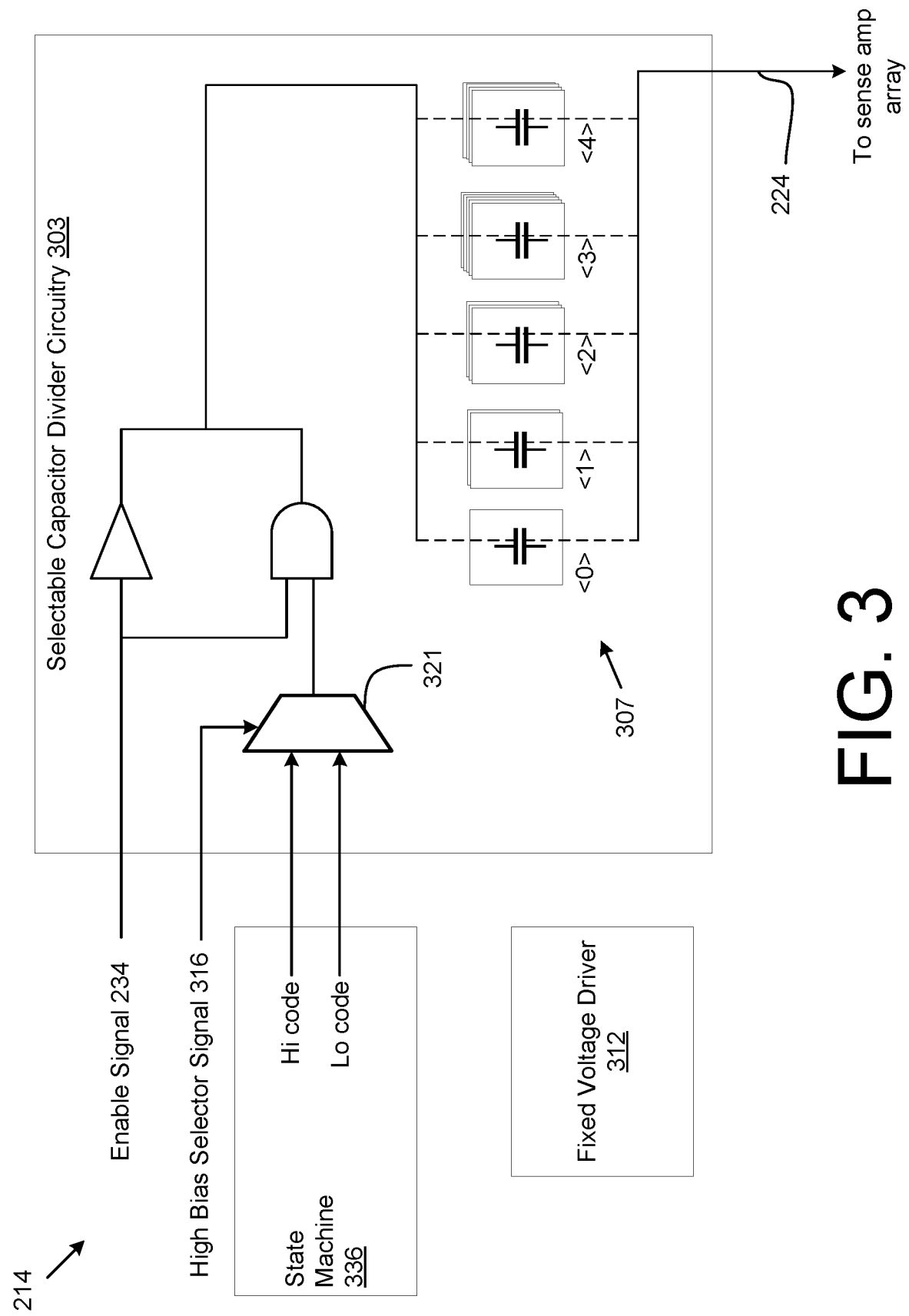
FIG. 3 is a drawing of a schematic of an adjustable bias signal generator using selectable capacitor divider circuitry according to embodiments of the present disclosure.

FIG. 3 is a drawing of a schematic of an adjustable bias signal generator 214 using selectable capacitor divider circuitry 303 according to embodiments of the present disclosure. The use of selectable capacitor divider circuitry 303 makes the bias signal generator adjustable. In this embodiment, the bias signal 224 can be generated instantaneously using selectable capacitor divider circuitry 303. The selectable capacitor divider circuitry 303 includes a set of capacitors 307 arranged to form different capacitor dividers. Each capacitor divider has a different capacitance defined by a ratio of capacitors 307 within the capacitor divider. In addition, each capacitor divider corresponds to a different digital code. The example shows capacitor dividers having digital codes made up of capacitors ranging from <0> to <4>. The digital code allows for the selection of a specific capacitor divider among the set of possible capacitor dividers. Thus, the capacitive ratio can be controlled by selecting a digital code.

The voltage driver of the adjustable bias signal generator 214 may be a fixed voltage driver 312. The fixed voltage driver 312 may be manufactured to generate predefined output voltages for different bias conditions (e.g., a higher voltage signal for a high bias condition and a lower voltage signal for a low bias condition).

For example, a first bias condition may be a condition where an amplifier (e.g., a sense amplifier 202) is placed in an auto-zero phase. Auto-zeroing refers to the cancelling of an input offset using different clock phases. Offset includes an intrinsic voltage/current amount that is inadvertently added to an input voltage/current. The auto-zero phase may require a relatively higher bias level with a higher bias voltage as the first bias condition. Thereafter, a second bias condition may be applied. The second bias condition may a bias condition applied to a sense amplifier 202 to perform a read/access operation. For example, the sense amplifier 202 may be coupled to a bit line or other memory access line. The sense amplifier 202 may need to be biased according to a particular voltage or current to sense the state of the memory cell. A relatively low bias signal with a lower bias voltage may be used for the second bias condition.

The fixed voltage driver 312 may be bandgap-based or a current mirror with a resistor controlling the output current. The fixed voltage driver 312 may be coupled to the selectable capacitor divider circuitry 303 to generate the bias signal 224.

The selectable capacitor divider circuitry 303 may include a multiplexor (mux) that receives a digital code for a high bias circuit divider configuration ("hi code) and a digital code for a low bias circuit divider configuration no code"). The selection of which digital code to use may be made by a high bias selector signal 316. The high bias selector signal 316 may take on different values depicting on whether the bias signal 224 should be at a higher bias level or a lower bias level. By multiplexing different digital codes locally near the sense amplifier array, sense amplifiers may quickly switch between the high bias operating mode and the low bias operating mode. The selectable capacitor divider circuitry 303 may also receive an enable signal 234. This may trigger an enable switch to control whether the sense amplifiers are in a standby mode.

The adjustable bias signal generator 214 of FIG. 3 may also include a state machine 336. The state machine 336 may include microcode to perform a short linear search to identify the appropriate digital codes of capacitor dividers.

In this respect, the state machine 336 selects the capacitor divider by sequentially activating capacitor dividers and comparing an output of each activated capacitor divider to the reference signal of 231 of a reference signal generator 228. The state machine 336 may store a digital code for a high bias condition and a digital code for a low bias condition.

To illustrate an example of FIG. 3, the sense amplifier array may begin in standby mode. In this case, the enable signal 234 in a low state indicates a disabled state. When in standby mode, power consumption is low as the sense amplifiers 202 are not biased and therefore, not drawing current. The sense amplifiers 202 may then enter a high bias condition when enable signal 234 goes high. In this case, a high bias signal is sent to the fixed voltage driver 312 to generate an intermediate high bias signal. In addition, the high bias selector signal causes the mux to select the hi code. This selects a particular capacitor divider within the selective capacitor divider circuitry 303. The intermediate high bias signal couples with the selected capacitor divider (which corresponds to the hi code). This results in a bias signal 224 that is at a high level to drive the sense amplifier array 201 at a high bias condition. When it is time to enter a low bias condition, a low bias signal is sent to the fixed voltage driver 312 to generate an intermediate low bias signal. In addition, the high bias selector signal causes the mux to select the lo code. This selects a different capacitor divider within the selective capacitor divider circuitry 303. The intermediate low bias signal couples with the selected capacitor divider (which corresponds to the lo code). This results in a bias signal 224 that is at a low level to drive the sense amplifier array 201 at the low bias condition.

Figure 4:
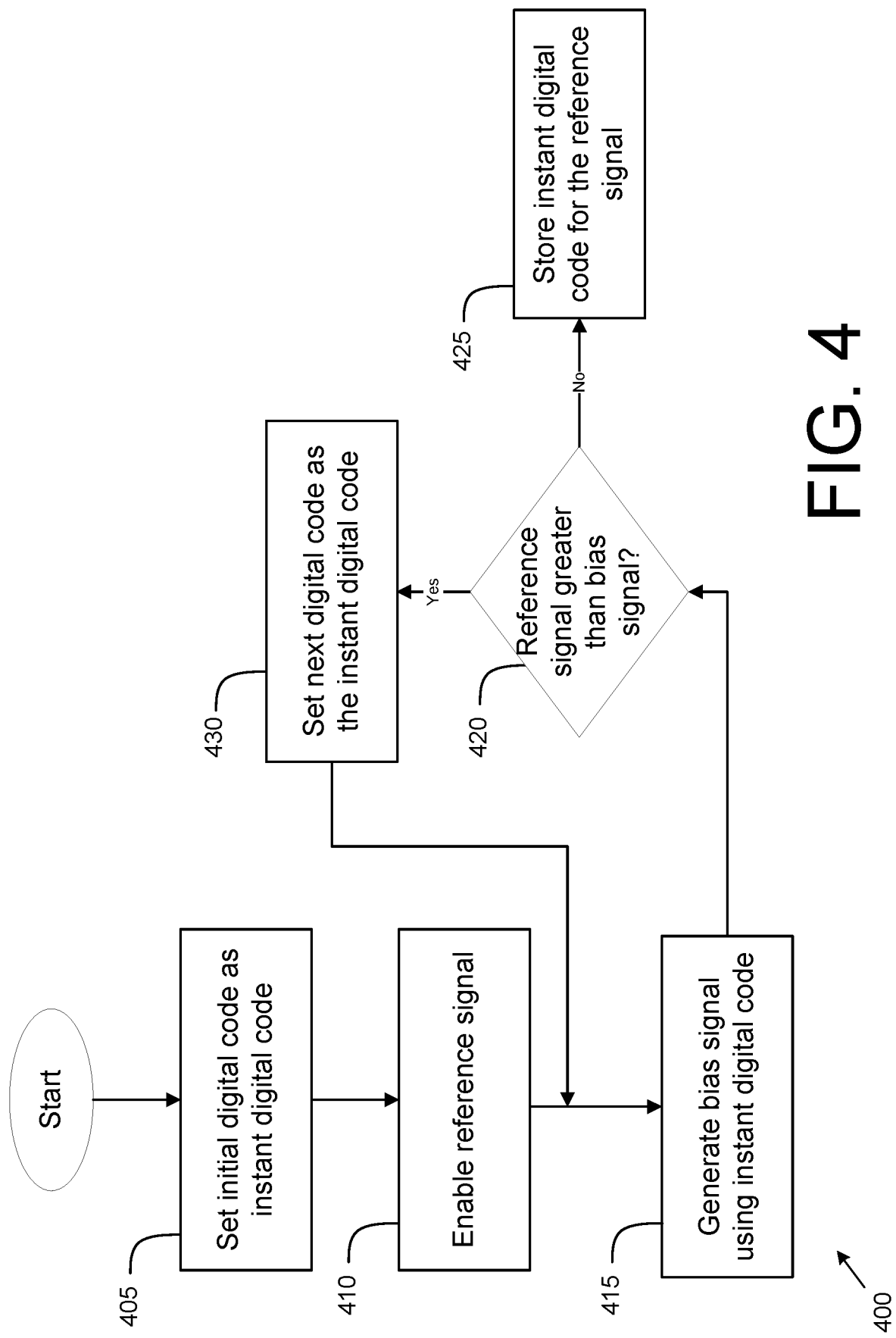
FIG. 4 is a flowchart illustrating an example of the functionality relating to the state machine of FIG. 3 according to various embodiments.

FIG. 4 is a flowchart illustrating an example of the functionality relating to the state machine 336 of FIG. 3 according to various embodiments. It is understood that the flowchart of FIG. 4 provides an illustrative example of the many different types of functional arrangements that may be employed to implement the state machine 336 as described herein. The flowchart of FIG. 4 may also be viewed as depicting an example of a method 400 implemented in the adjustable bias signal generator 214 of FIG. 3 according to one or more embodiments. Specifically, FIG. 4 shows an example of functionality of a state machine 336 configured to select a capacitor divider by sequentially activating capacitor dividers (e.g., by sequencing through digital codes) and comparing an output of each activated capacitor divider to the reference signal.

To begin, at item 405 the state machine 336 may set the initial digital code as the instant digital code. The instant digital code may be stored temporarily as it represents the digital code currently being tested. The initial digital code may refer to the digital code at the beginning of a sequence of digital codes. In some embodiments, the initial digital code may identify the capacitor divider having the lowest capacitance, where the digital code is incremented to sequence through the capacitor dividers with increasing capacitances. In some embodiments, the initial digital code may identify the capacitor divider having the highest capacitance, where the digital code is decremented to sequence through the capacitor dividers with decreasing capacitances. In any case, the initial digital code represents the first digital code in a particular sequence.

At item 410, the state machine 336 enables the reference signal 231. The reference signal 231 is therefore received for purposes of performing a comparison as discussed in further detail below. To enable the reference signal 231, a reference signal may be applied to or latched onto a particular conductive path. The reference signal 231 may be switched on use a digital transistor.

At item 415, the state machine 336 may generate the bias signal using the instant digital code. For example, the state machine 336 may select the capacitor divider represented by the instant digital code. The state machine 336 may then generate the bias signal using the voltage provided by a fixed voltage driver and the selected capacitor divider.

At item 420, the state machine 336 checks whether the reference signal is greater than bias signal. In this respect, the state machine 336 is searching for a match when the reference signal is the same or nearly the same as the bias signal. The bias signal is generated according to the capacitor divider of the instant digital code. If the reference signal is not greater, then, at item 425, the state machine 336 may store the instant digital code for the reference signal. Here, the state machine identifies the digital code of the capacitor divider that causes the bias signal to match closely with the reference signal.

If the reference signal is not greater than the bias signal, then, at item 430, the state machine 336 sets the next digital code as the instant digital code. The state machine 336 thus sequences to the next digital code thereby incrementing or decrementing the output capacitance of the capacitor divider circuitry.

This process continues until the proper digital code is identified for a given reference signal. This process may repeat for different reference signals having different levels (e.g., a reference signal for a high bias condition or a reference signal for a low bias condition). This allows for the identification of a digital code for a high bias condition and a different digital code for the low bias condition.

The process in the flowchart of FIG. 4 may represent an initialization process to initially obtain digital codes for the selectable capacitor divider circuitry 303.

Figure 5:
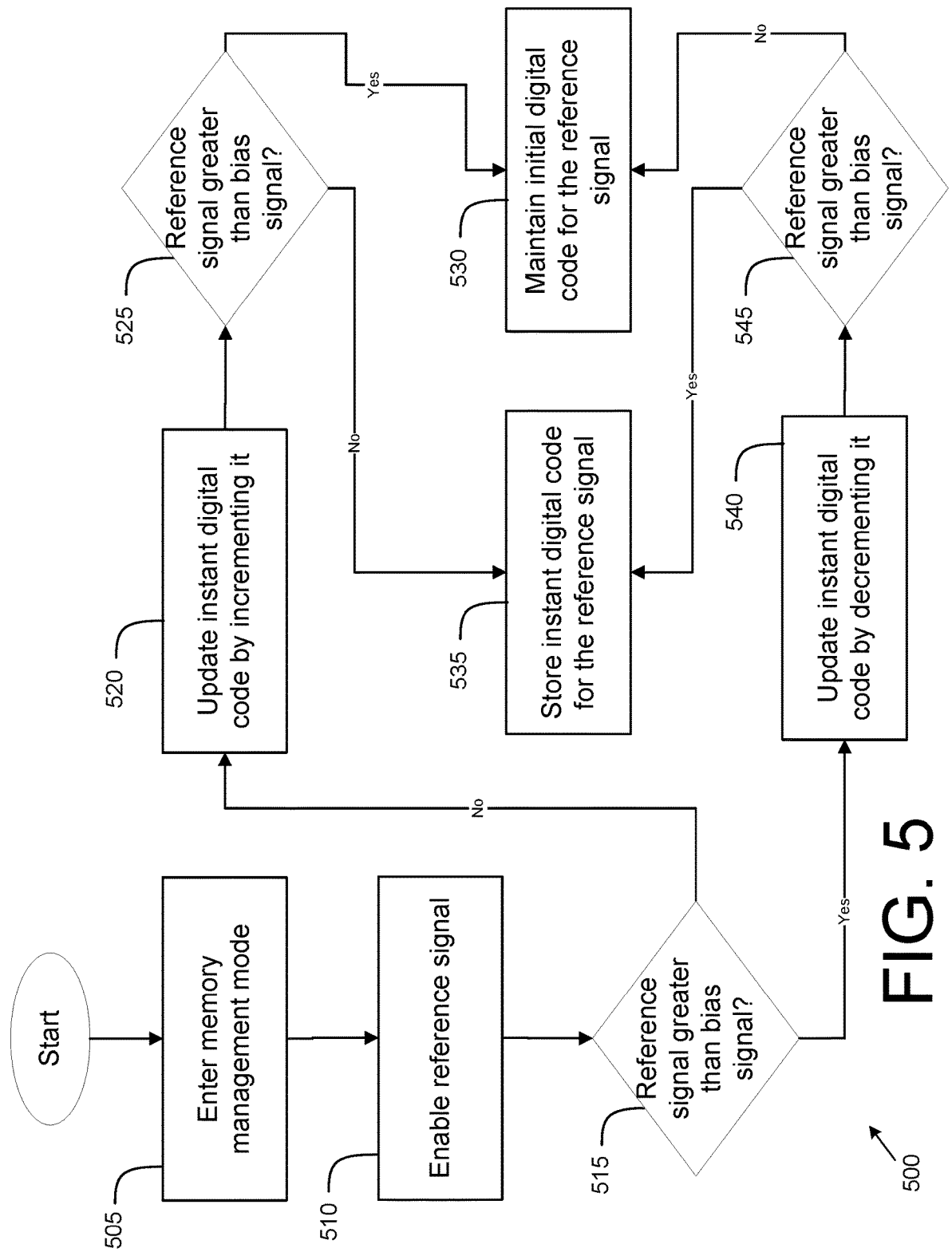
FIG. 5 is a flowchart illustrating an example of the functionality relating to updating digital codes according to various embodiments.

FIG. 5 is a flowchart illustrating an example of the functionality relating to updating digital codes according to various embodiments. This may involve state machine 336 of FIG. 3. It is understood that the flowchart of FIG. 5 provides an illustrative example of the many different types of functional arrangements that may be employed to implement the state machine 336 as described herein. The flowchart of FIG. 5 may also be viewed as depicting an example of a method 500 implemented in the adjustable bias signal generator 214 of FIG. 3 according to one or more embodiments.

At item 505, a memory management mode is entered. A memory management mode may be a scheduled mode that a memory device automatically enters to perform a variety of memory management tasks (e.g., a memory cell refresh). Embodiments of the present disclosure take advantage of the memory management mode by allowing the digital codes to be updated to track any environmental changes. For example, temperature may affect the output of the voltage driver. As a result, the digital codes (which select a particular capacitor divider) may need to be updated with temperature changes to change the bias signal so that it adapts to temperature changes. Thus, the process begins with the stored digital code as the initial digital code. As explained below, the process determines whether to update the initial digital code by incrementing it or decrementing it or whether to maintain the initial digital code as the same.

At item 510, the state machine 336 enables the reference signal 231. To enable the reference signal 231, a reference signal may be applied to or latched onto a particular conductive path. The reference signal 231 may be switched on use a digital transistor.

At item 515 the state machine 336 determines whether the reference signal is greater than the bias signal, which is generated using the instant digital code. This is similar to item 410 of FIG. 4. The process splits into two separate branches to check if the instant digital code should be incremented, decremented, or maintained the same.

If the reference signal is not greater than the bias signal, then at item 520, the instant digital code is updated by incrementing it.

At item 525, the state machine 336 determines whether the reference signal is greater than bias signal using the incremented digital code. If yes, then at item 530, the state machine 336 maintains the initial digital code for the reference signal. In other words, no change is made to the stored digital code. If no, then at item 535, the state machine stores the instant digital code (which is incremented relative to initial digital code) as the new instant code for the reference signal.

In the other branch, at item 540, the state machine updates the instant digital code by decrementing it. Then, at item 545, the state machine 336 determines whether the reference signal is greater than the bias signal. If no, then at item 530, the state machine 336 maintains the initial digital code for the reference signal. In other words, no change is made to the stored digital code. If yes, then at item 535, the state machine stores the instant digital code (which is decremented relative to initial digital code) as the new stored code for the reference signal.

The process described above may occur according to a predetermined schedule (e.g., one every 100 milliseconds or at a certain time during memory management mode). This allows the selected capacitor divider to be updated as environmental conditions change. In addition, the process may be separately applied to the reference signal for a high bias condition and the reference signal for the low bias condition.

Figure 6:
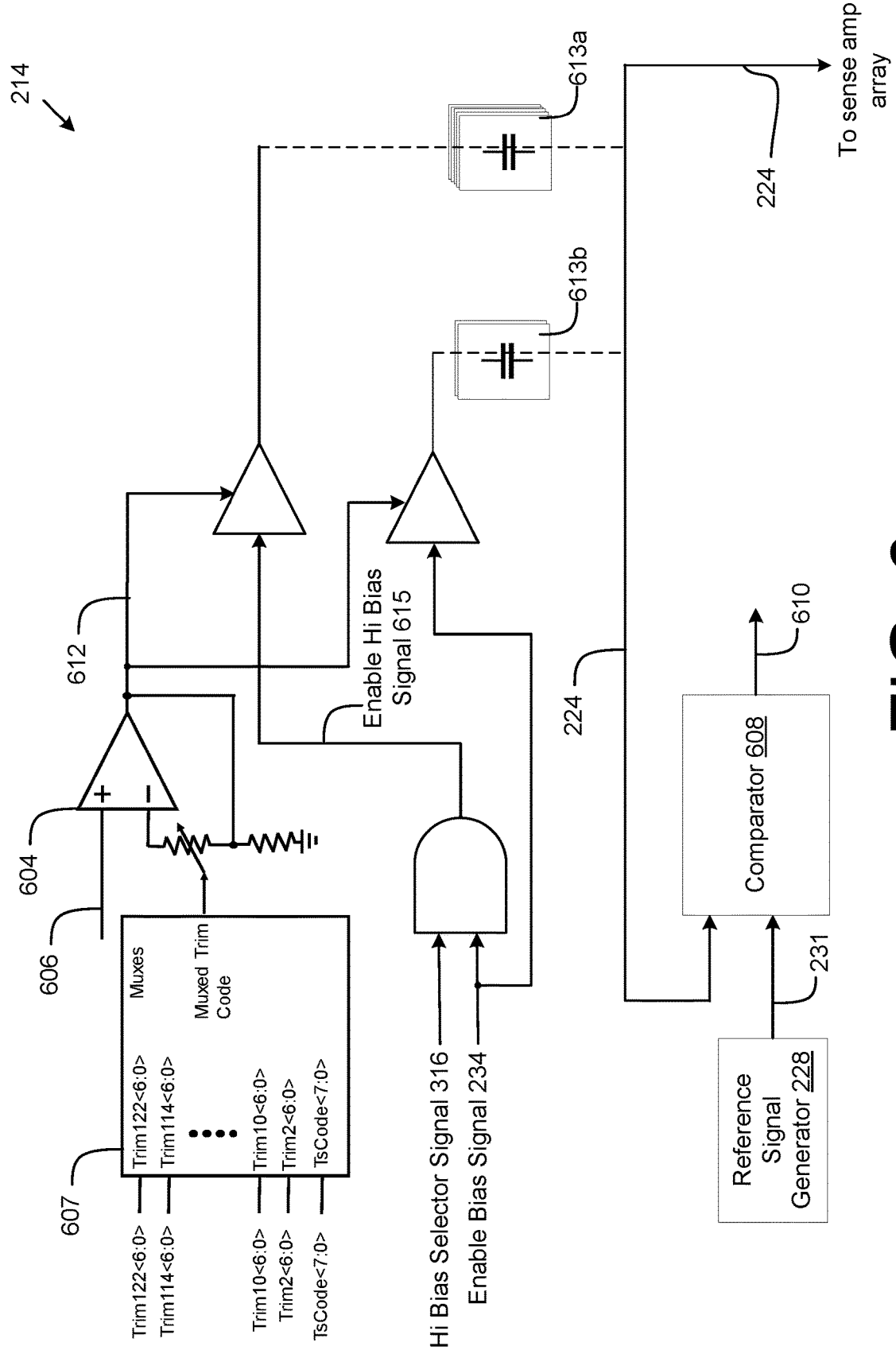
FIG. 6 is a drawing of a schematic of an adjustable bias signal generator using an adjustable voltage driver according to embodiments of the present disclosure.

FIG. 6 is a drawing of a schematic of an adjustable bias signal generator 214 using an adjustable voltage driver 604 according to embodiments of the present disclosure. In some embodiments, the capacitor divider circuitry of the adjustable bias signal generator comprises fixed capacitor divider circuitry, wherein the adjustable bias signal generator is adjusted by trimming a digital voltage driver to match the reference signal. The adjustable voltage driver 604 can be described in two phases: the trimming phase and the operation phase.

During the trimming phase, the adjustable voltage driver 604 is adjusted to generate a target output. That may take place during manufacturing. For example, the adjustable voltage driver 604 may receive a fixed voltage input 606 (e.g., 0.8 volts) generated by a bandgap reference circuit. The adjustable voltage driver 604 may be adjusted by configuring the adjustable resistor 607 to a particular value. The adjustable resistor 607 may be adjusted by setting trim values. Trimming includes a process where components on a semiconductor die are physically modified. This may include blowing fuses to set specific resistive values or lasering/burning/etching notches in the semiconductor device at specific points to change resistive values. The adjustable resistor 607 is configured to a specific resistance by applying trim settings.

To determine the trim settings, a comparator 608 compares a bias signal 224 to a reference signal 231 to generate a comparison signal 610. Specifically, the adjustable voltage driver 604 generator generates an output signal 612 based on the trim settings. The output signal 612 drives capacitor divider circuitry made up of different capacitor dividers 613a, 613b. When the enable signal 234 transitions high, the capacitor divider drive the bias signal 224 to a higher bias level if the input Hi Bias selector 316 is high. When the input Hi Bias selector 316 transitions low, the bias signal 224 is driven to a lower bias level. During manufacturing a tester may read the comparison signal 610 to compare the bias signal 224 to a reference signal 231. The tester may be external equipment that probes the electronic device to measure current/voltage at specific terminals. The tester may execute a test program that adjusts the trim settings until the trim settings result in the output signal 612 to be equal to the reference signal 231. This means that the output signal 612 is adjusted so that it drives a fixed capacitor divider arrangement at a desired bias level.

In some embodiments, the adjustable voltage driver 604 may have trim settings to allow for temperature compensation. Ambient temperature impacts the output signal of the adjustable voltage driver 604 (assuming there is no temperature compensation). For example, as temperature increases, the output of the adjustable voltage driver 604 may lower in strength. To address this, multiple trim settings may be applied that correspond to different temperatures. The trim settings may be multiplexed. A thermometer may sense the temperature and provide a signal indicating the temperature to the multiplexor. The appropriate trim setting may be selected based on the temperature. As a result, the output of the adjustable voltage driver 604 is constant over a range of temperatures using multiplexed trim settings that are temperature compensated. This temperate compensation can allow for the bias voltage 224 to compensate for the expected threshold voltage (Vt) shift of one or more transistors over the temperature range.

To explain further, when trimming the adjustable resistor 607 of the adjustable voltage driver 604, a reference signal 231 is provided while the ambient temperature of the electronic device/wafer is cooled to a known low temperature. A trim setting is applied at this known low temperature. Then the ambient temperature is heated to a known high temperature and the process is repeated by applying a different trim setting at the known high temperature. This creates different trim settings at different temperatures. Additional trim settings may be applied through interpolation of temperatures in between the high and low temperatures.

After the adjustable voltage driver 604 is trimmed to generate a specific output signal 612, the trimming phase ends. The adjustable voltage driver 604 may then function in an operation phase to bias a sense amplifier array in the field. As explained above, the adjustable voltage driver 604 generates an output signal 612 that is the supply voltage for the capacitive divider circuitry. The capacitor dividers may include two capacitor dividers 613a, 613b, each having a fixed capacitive ratio. For the high bias condition (e.g., during the autozero stage), a first capacitor divider 613a and a second capacitor divider 613b each switch from low to high. For the low bias condition (e.g., during the later data sensing) one of the capacitor divider 613a or 613b switches from high to low. Thus, each bias condition corresponds to a particular fixed capacitor divider arrangement. A capacitor divider arrangement may have some capacitor dividers switched on while others switched off. Different capacitor divider arrangements may be used from the same set of capacitor dividers 613a, 613b.

For example, the adjustable bias signal generator 214 may receive an enable hi bias signal 615 and an enable bias signal 234. The enable hi bias signal 615, when active, switches on the first capacitor divider 613a. The enable bias signal 234, when active, switches on the second capacitor divider 613b. Thus, in a hi bias condition the enable hi bias signal 615 and the enable bias signal 234 are both active. In a lo bias condition, the hi bias signal 615 is inactive and the enable bias signal 234 is active.

The embodiment of FIG. 6 is advantageous because it provides temperature compensation (through multiplexed trim settings), simplified wiring, while also allowing for a plurality of bias conditions with a relatively short time for the bias signal to settle.

The foregoing components and/or their functionality may be implemented a various systems and methods. Some embodiments include an electronic device such as, for example, an integrated circuit, chip, die, or other semiconductor device. The electronic device may be a memory device comprising memory arrays and peripheral circuitry, microprocessors, general purpose processors, or special purpose processors, discrete logic circuits having logic gates for implementing various logic functions, application specific integrated circuits (ASICs) having appropriate logic gates, field-programmable gate arrays (FPGAs), or other semiconductor devices, etc.

Various components described herein (e.g., amplifiers, transistors, switches, active components, signal generators, etc.) may be implemented using transistors or other similar switching components. A switching component or a transistor discussed herein may represent a field effect transistor (FET) and comprise a three terminal device including a source, drain, and gate. The terminals may be connected to other electronic elements through conductive materials, e.g., metals. The source and drain may be conductive and may comprise a heavily doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is ptype (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

Some embodiments may include methods for manufacturing the electronic device. This may involve techniques related to semiconductor fabrication or other techniques of coupling electronic circuits together to form conductive paths for electronic communication. Methods further include operating a device after it has been manufactured or otherwise produced and ready for operation in the field. For example, operating an electronic device includes generating signals (e.g., voltages, currents), activating, switching, sensing, or reading signals.

Terms such as "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components.

At any given time, the conductive path between components that are in electronic communication with each other (or in conductive contact with or connected with or coupled with) may be an open circuit or a closed circuit based on the operation of the device that may include the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" includes the condition of moving from an open-circuit relationship between components in which signals are not presently capable of being communicated between the components over a conductive path to a closed-circuit relationship between components in which signals can be communicated between components over the conductive path. When a component, such as a transistor, switching component in conduction with conductive paths couple other components together, the component initiates a change that allows signals to flow between the other components over the conductive path that previously did not permit signals to flow.

It should be noted that the methods described above describe possible implementations, and that the operations and the steps may be rearranged or otherwise modified and that other implementations are possible. Furthermore, features from two or more of the methods may be combined. Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths. and/or operating the electronic device after it has been manufactured.

In addition, the foregoing components may be embodied as program code using a hardware description language such as, for example, Verilog, VHDL, or other similar languages. The program code may be stored in computer-readable medium. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

The flowcharts discussed above show the functionality and operation of an implementation of components within a system or electronic device. Each block may represent a circuit or a number of interconnected circuits to implement the specified logical function(s).

Although the flowcharts show a specific order of execution, it is understood that the order of execution may differ from that which is depicted. For example, the order of execution of two or more boxes may be scrambled relative to the order shown. Also, two or more boxes shown in succession may be executed concurrently or with partial concurrence. Further, in some embodiments, one or more of the boxes may be skipped or omitted. It is understood that all such variations are within the scope of the present disclosure.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. An electronic device comprising:
   a reference signal generator configured to generate a reference signal for a memory array;
   a capacitor divider circuit comprising a set of capacitor dividers configured to generate a bias signal by selecting a capacitor divider among the set of capacitor dividers in response to the reference signal; and
   a sense amplifier array of the memory array, the sense amplifier array is configured to be biased according to the bias signal.

2. The electronic device of claim 1, wherein each capacitor divider in the set of capacitor dividers corresponds to a respective digital code.

3. The electronic device of claim 1, further comprising a state machine configured to select a given capacitor divider from the set of capacitor dividers by sequentially activating the set of capacitor dividers and comparing an output of each activated capacitor divider to the reference signal.

4. The electronic device of claim 1, further comprising a state machine configured to select a given capacitor divider from the set of capacitor dividers according to a predetermined schedule to update the given capacitor divider.

5. The electronic device of claim 1, wherein a first capacitor divider from the set of capacitor dividers is selected for a high reference signal for a high bias condition and a second capacitor divider from the set of capacitor dividers is selected for a low reference signal for a low bias condition.

6. The electronic device of claim 5, further comprising a multiplexor configured to receive a digital code for a high reference signal and a digital code for a low reference signal.

7. The electronic device of claim 6, further comprising an enable switch to set the sense amplifier array in a standby mode.

8. The electronic device of claim 5, further configured to trim a digital voltage driver to match a voltage of the bias signal with a voltage of the reference signal.

9. The electronic device of claim 8, further configured to drive a first capacitor divider arrangement in response to the high reference signal and drive a second capacitor divider arrangement in response to the low reference signal.

10. The electronic device of claim 9, where in the digital voltage driver comprises a plurality of trim settings corresponding to different temperatures.

11. The electronic device of claim 8, wherein the digital voltage driver comprises at least one of a bandgap reference voltage generator or a current mirror having a resistor controlling a current of the reference signal.

12. A method comprising:
    receiving, by an adjustable bias signal generator, a reference signal for a memory array;
    generating, by the adjustable bias signal generator, a bias signal by selecting a capacitor divider among a set of capacitor dividers in response to the reference signal; and
    biasing a sense amplifier array of a memory array according to the bias signal.

13. The method of claim 12, further comprising:
    selecting a given capacitor divider from the set of capacitor dividers by sequentially activating the set of capacitor dividers; and
    comparing an output of each activated capacitor divider to the reference signal.

14. The method of claim 12, further comprising selecting and comparing according to a predetermined schedule to update a given capacitor divider in the set of capacitor dividers.

15. The method of claim 12, wherein a first capacitor divider from the set of capacitor dividers is selected for a high reference signal for a high bias condition and a second capacitor from the set of capacitor dividers is selected for a low reference signal for a low bias condition.

16. The method of claim 15, further comprising receiving, by a multiplexor, a digital code for a high reference signal and a digital code for a low reference signal.

17. The method of claim 15, further comprising trimming a digital voltage driver to match a voltage of the bias signal with a voltage of the reference signal.

18. The method of claim 17, further comprising driving a first capacitor divider arrangement in response to the high reference signal and drive a second capacitor divider arrangement in response to the low reference signal.

19. The method of claim 12, further comprising adjusting a trim setting of a digital voltage driver based on a current temperature.

20. The method of claim 12, further comprising controlling a current of the reference signal via a bandgap reference voltage generator or a current mirror having a resistor.

* * * * *